United States Patent
Nagatomo et al.

(10) Patent No.: US 8,488,643 B2
(45) Date of Patent: Jul. 16, 2013

(54) PHOTONIC-CRYSTAL SURFACE EMITTING LASER, LASER ARRAY USING THE LASER, AND IMAGE FORMING APPARATUS USING THE LASER ARRAY

(75) Inventors: Yasuhiro Nagatomo, Kawasaki (JP); Shoichi Kawashima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 53 days.

(21) Appl. No.: 13/230,647

(22) Filed: Sep. 12, 2011

(65) Prior Publication Data
US 2012/0063480 A1    Mar. 15, 2012

(30) Foreign Application Priority Data
Sep. 14, 2010  (WO) .................. PCT/JP2010/065875

(51) Int. Cl.
*H01S 5/00* (2006.01)
(52) U.S. Cl.
USPC .................................... 372/44.011
(58) Field of Classification Search
USPC ................... 372/50.124, 41, 44.011
See application file for complete search history.

(56) References Cited

U.S. PATENT DOCUMENTS

| | | | | |
|---|---|---|---|---|
| 2007/0121694 A1* | 5/2007 | Okamoto | ................. | 372/50.124 |
| 2007/0201526 A1* | 8/2007 | Hori | .......................... | 372/50.124 |
| 2009/0116527 A1* | 5/2009 | Arimura | .................... | 372/46.01 |

FOREIGN PATENT DOCUMENTS

| | | |
|---|---|---|
| JP | 11-135770 A | 5/1999 |
| JP | 11-251631 A | 9/1999 |
| JP | 2000-021789 A | 1/2000 |
| JP | 2000-332351 A | 11/2000 |
| JP | 2009-111360 A | 5/2009 |

\* cited by examiner

*Primary Examiner* — Jessica Stultz
*Assistant Examiner* — Tuan Nguyen
(74) *Attorney, Agent, or Firm* — Canon U.S.A., Inc. IP Division

(57) ABSTRACT

A laser structure is provided in which an influence caused by a concave-convex structure on laser characteristics is reduced when the Epitaxial Lateral Overgrowth (ELO) technique is applied to a photonic-crystal surface emitting laser. A height of the mask structure is set such that a reflection peak wavelength of 0-th order diffracted light and a reflection peak wavelength of first-order diffracted light differ from each other for light that enters a concave-convex periodic structure, which is constituted by a first layer and a mask structure, from a photonic crystal. Further, reflection intensity of the 0-th order diffracted light from the concave-convex periodic structure is larger than reflection intensity of the first-order diffracted light from the concave-convex periodic structure at an oscillation wavelength $\lambda$.

10 Claims, 15 Drawing Sheets

PHOTONIC-CRYSTAL SURFACE EMITTING LASER, LASER ARRAY USING THE LASER, AND IMAGE FORMING APPARATUS USING THE LASER ARRAY

TECHNICAL FIELD

Embodiments of the present invention relate to a photonic-crystal surface emitting laser, and more particularly to a photonic-crystal surface emitting laser that utilizes lateral growth for an improvement of crystal quality.

BACKGROUND ART

Recently, many proposals of applying photonic crystals to semiconductor lasers have been reported. Japanese Patent Laid-Open No. 2000-332351 discloses a light source employing a surface emitting laser in which an active layer including a light-emitting material is provided and a two-dimensional photonic crystal is formed in the vicinity of the active layer. The disclosed photonic-crystal surface emitting laser is one type of Distribution Feedback (DFB) laser and has a resonance mode in the in-plane direction of a substrate. In the two-dimensional photonic crystal, columnar holes are periodically formed in a semiconductor layer, and a distribution of its refractive index has two-dimensional periodicity. With the two-dimensional periodicity, part of light generated in the active layer, which has a particular wavelength, resonates to form standing waves, thus causing laser oscillation. Further, the light is taken out in a direction perpendicular to the laser surface with first-order diffraction, and a thus-obtained laser device operates as the surface emitting laser.

Trial products of the photonic-crystal surface emitting laser have been so far fabricated by using various compound semiconductors. Photonic-crystal surface emitting lasers using nitride semiconductors have also been studied.

When trying to reduce the cost of a nitride semiconductor laser, it is advantageous to employ an inexpensive heterogeneous substrate, e.g., a sapphire substrate, instead of an expensive GaN substrate. However, if crystal growth is developed on a heterogeneous substrate as it is, a difficulty arises in obtaining a high-quality crystal less subjected to transitions. In view of such a difficulty, the so-called ELO (Epitaxial Lateral Overgrowth) technique is often utilized for an improvement of crystal quality. With the ELO technique, some concave-convex structure is formed on a substrate or in a compound semiconductor layer to develop crystal growth in the lateral direction, thereby obtaining a crystal less subjected to transitions.

Japanese Patent Laid-Open No. 2000-021789 discloses a structure in which the ELO technique is applied to an edge emitting semiconductor laser.

When the ELO technique is applied to the photonic-crystal surface emitting laser, the following problem occurs which is not caused with the edge emitting laser disclosed in the Japanese Patent Laid-Open No. 2000-021789.

FIG. 11 is a schematic view to explain the structure of the edge emitting semiconductor laser disclosed in the above-cited Japanese Patent Laid-Open No. 2000-021789. In FIG. 11, reference numeral 1110 denotes a substrate, 1120 denotes a mask for selective growth, which is provided to implement the ELO technique, and 1150 denotes an active layer. In the edge emitting laser illustrated in FIG. 11, a resonance direction 1192 of laser light and emergent light 1190 are both restricted in the in-plane direction of the substrate 1110, and no light is emitted in a direction toward the substrate. Therefore, optical characteristics of the selective growth mask 1120 used in the ELO technique do not affect characteristics of a laser device.

SUMMARY OF INVENTION

According to embodiments of the present invention, there is provided a photonic-crystal surface emitting laser including an active layer and a photonic crystal, which has a resonance mode in an in-plane direction of a substrate, and oscillating at a wavelength $\lambda$, the photonic-crystal surface emitting laser further including a first layer having a first refractive index, a mask structure formed on the first layer, the mask structure including members having a second refractive index and arrayed periodically in the in-plane direction of the substrate, or including a member having the second refractive index and including openings arrayed periodically in the in-plane direction of the substrate, a third layer formed on the first layer and the mask structure and having a third refractive index differing from the first refractive index and the second refractive index, and the photonic crystal formed on the third layer, wherein a height of the mask structure is set such that a reflection peak wavelength of 0-th order diffracted light and a reflection peak wavelength of first-order diffracted light differ from each other for light that enters a concave-convex periodic structure, which is constituted by the first layer and the mask structure, from the photonic crystal, and reflection intensity of the 0-th order diffracted light from the concave-convex periodic structure is larger than reflection intensity of the first-order diffracted light from the concave-convex periodic structure at the wavelength $\lambda$.

Further features of the present invention will become apparent from the following description of exemplary embodiments with reference to the attached drawings.

DESCRIPTION OF EMBODIMENTS

Figure 1:
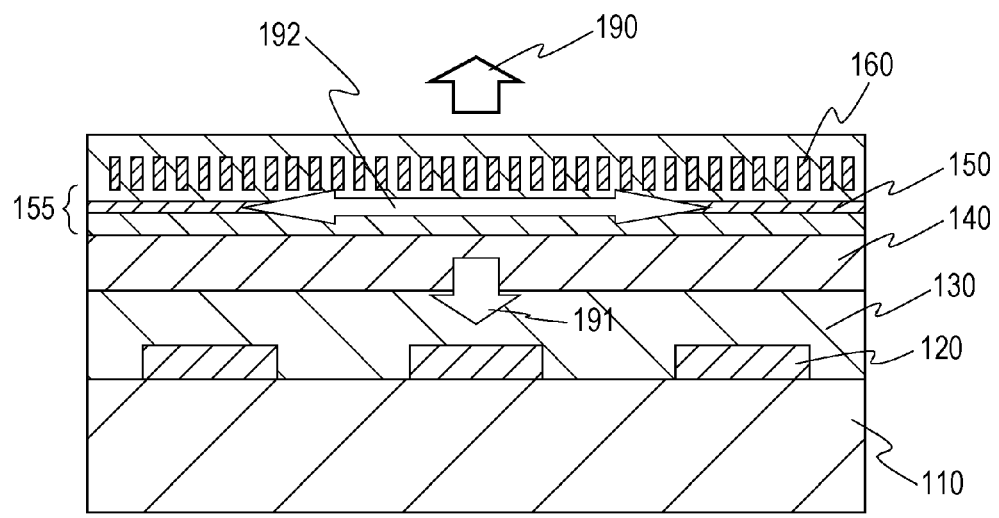
FIG. 1 is a schematic view to explain a photonic-crystal surface emitting laser according to an embodiment of the present invention.

As shown in FIG. 1, a resonance direction 192 is the in-plane direction of a substrate 110, while emergent lights 190 and 191 are directed perpendicular to the substrate 110. The emergent light 191 directing toward the substrate side reaches a mask 120 for selective growth, which is provided to implement the ELO technique, and reflection, diffraction, etc. are generated by a concave-convex structure that is constituted by both the substrate 110 and the selective growth mask 120. Hence, optical characteristics of the concave-convex structure greatly affect characteristics of a laser device. More specifically, light is diffracted by the concave-convex structure, and reflected light is generated in directions oblique to the substrate. Because the reflected lights in the oblique directions become stray lights, degradation of the laser characteristics may be caused with the reflected light. In view of the problem described above, an object of the present invention is to provide a laser structure in which an influence caused by a concave-convex structure on laser characteristics is reduced when the ELO technique is applied to a photonic-crystal surface emitting laser.

Embodiments of the present invention will be described below.

FIG. 1 is a schematic view to explain a photonic-crystal surface emitting laser or laser element to which an embodiment of the present invention is applied. Be it noted that, in this description, the substrate side of a laser device is defined as the lower side, and the side oppositely away from the substrate is defined as the upper side.

Reference numeral 110 denotes a first layer having a first refractive index. Reference numeral 120 denotes a mask structure having a second refractive index and employed as a mask for selective growth. In this embodiment, the mask structure is constituted by arraying stripe-shaped members periodically in the in-plane direction. Reference numeral 130 denotes a third layer having a third refractive index and formed such that the first layer 110 and the mask structure 120 are embedded with and in the third layer 130 according to the ELO technique. Further, a concave-convex structure is constituted by the first layer 110 and the mask structure 120. Reference numeral 140 denotes a clad layer, 150 denotes an active layer, 155 denotes an optical waveguide layer, and 160 denotes a photonic crystal.

Part of light generated in the active layer 150, which has a particular wavelength, couples with a resonance mode resonating in an in-plane direction 192 due to the distribution feedback effect by the photonic crystal 160 and forms standing waves, thus causing laser oscillation. Further, the light is partly taken out in a direction perpendicular to the laser surface with the first-order diffraction effect by the photonic crystal 160, and the laser device operates as a surface emitting laser.

The lattice form of the photonic crystal 160 in this embodiment may be a one-dimensional lattice or a two-dimensional lattice insofar as the lattice is able to form standing waves and to cause laser oscillation based on the distribution feedback effect. The one-dimensional lattice may be of a striped structure that is known as the form of a general diffraction grating. The two-dimensional lattice may be provided as, e.g., a square lattice, a triangular lattice, or a graphite lattice. Each lattice point may have a circular, elliptic, triangular, rectangular, or hexagonal shape. The pitch of the lattice is designed to be an integer multiple of an oscillation wavelength λ in terms of optical path length.

(Height of Concave-Convex Structure)

The first-order diffraction at the photonic crystal occurs toward not only the upper side, but also the lower side. Therefore, the laser light is divided into emergent light 190 directing to the upper side and emergent light 191 directing to the lower side. The emergent light 191 directing to the lower side reaches the concave-convex structure and causes reflection and diffraction.

When the members disposed on the substrate are periodically arrayed, the concave-convex structure serves as a diffraction grating and light is strongly reflected in a particular direction.

Figure 2:
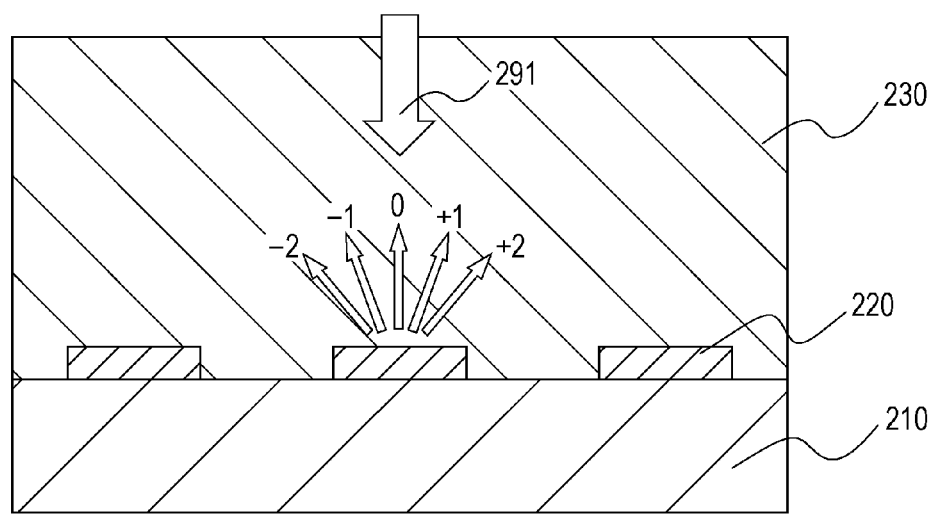
FIG. 2 is a schematic view to explain reflections of light with a concave-convex structure in the embodiment of the present invention.

FIG. 2 is a schematic view to explain reflections caused when incident light 291 enters the concave-convex structure, which is constituted by both a substrate 210 and members 220, from the photonic crystal through a member 230 in a direction perpendicular to the substrate. As illustrated in FIG.

2, when the incident light 291 enters the concave-convex structure, there occur not only a component reflected in the direction perpendicular to the substrate surface, but also components reflected in oblique directions at certain angles with respect to the perpendicular direction due to diffraction. In this description, as illustrated in FIG. 2, the light reflected in the direction perpendicular to the substrate is defined as 0-th order diffracted light, and orders of diffracted lights are defined as ± first-order, ± second-order, etc. in sequence from ones nearest to the 0-th order diffracted light.

FIG. 3 illustrates several concave-convex structures and calculation result of reflection spectra. Be it noted that, in this description, the reflection spectra are calculated with an electromagnetic simulation using a transfer matrix method.

Figure 3A:
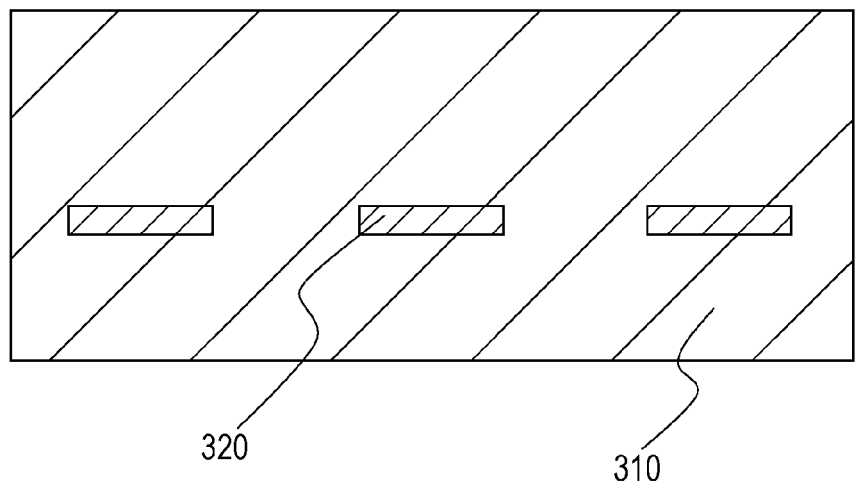
FIG. 3A is an illustration to explain a shape of the concave-convex structure and reflection spectra in the embodiment of the present invention.

In FIG. 3A, members 320 constituting a striped structure are arrayed in a member 310. The member 310 has a refractive index of 2.55, and the members 320 have a refractive index of 1.47, a pitch of 6 μm, and a height of 900 nm.

Figure 3B:
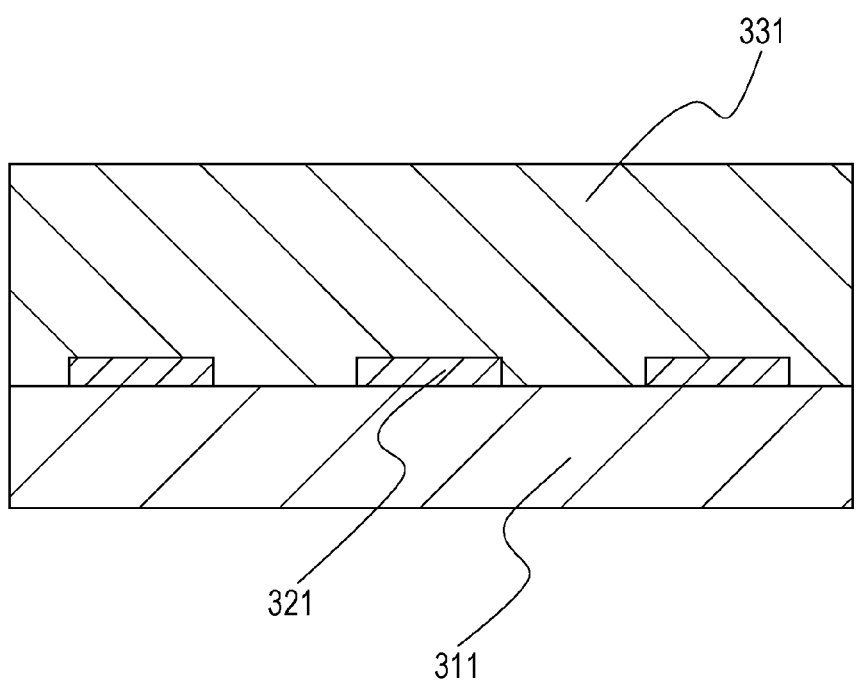
FIG. 3B is an illustration to explain a shape of the concave-convex structure and reflection spectra in the embodiment of the present invention.

In FIG. 3B, members 321 constituting a striped structure are arrayed immediately on a member 311. The member 311 and the members 321 are embedded with and in a member 331. The member 311 has a refractive index of 1.79, and the members 321 have a refractive index of 1.47, a pitch of 6 μm, and a height of 900 nm. The member 331 has a refractive index of 2.55.

Figure 3C:
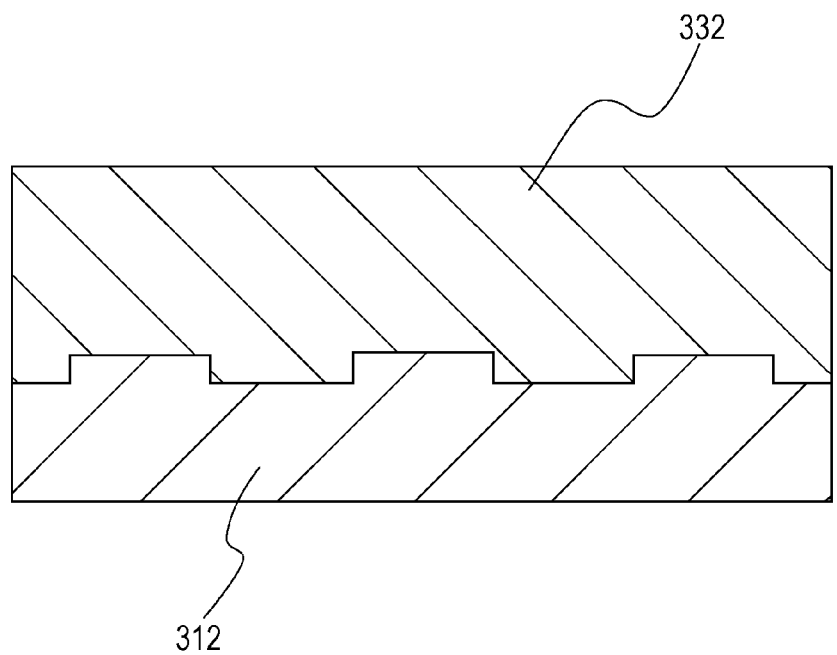
FIG. 3C is an illustration to explain a shape of the concave-convex structure and reflection spectra in the embodiment of the present invention.

In FIG. 3C, a concave-convex structure is formed by processing a member 312. The member 312 has a refractive index of 1.79, and a striped structure formed by the member 312 has a pitch of 6 μm and a height of 900 nm. Further, a member 332 has a refractive index of 2.55.

Figure 3D:
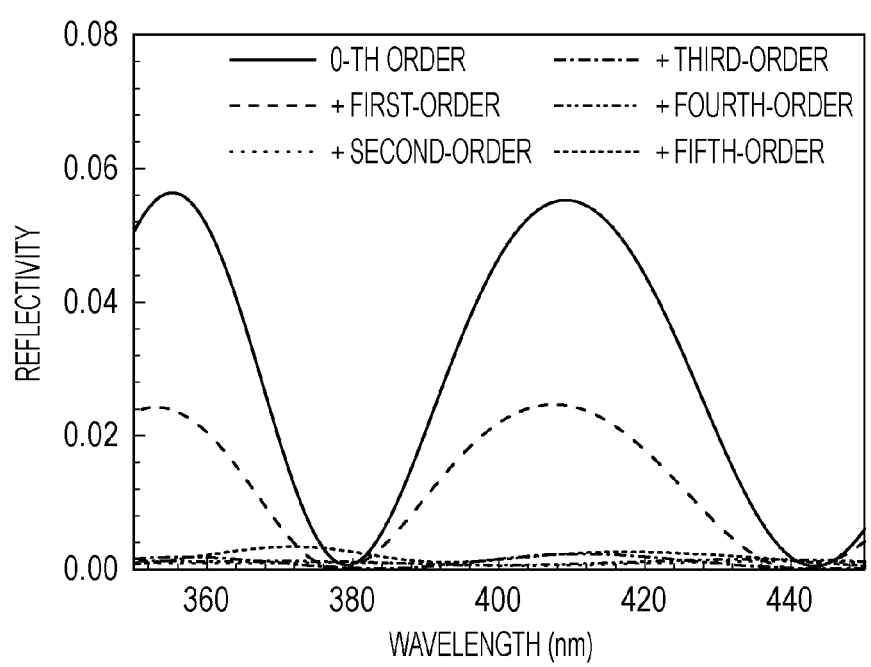
FIG. 3D is a graph to explain the shape of the concave-convex structure and the reflection spectra in the embodiment of the present invention.
Figure 3E:
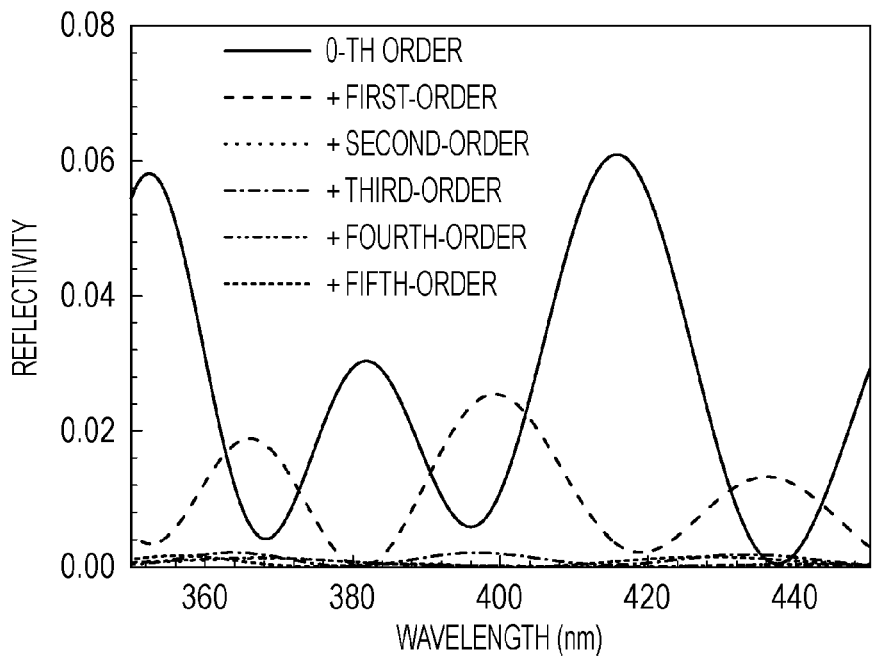
FIG. 3E is a graph to explain the shape of the concave-convex structure and the reflection spectra in the embodiment of the present invention.
Figure 3F:
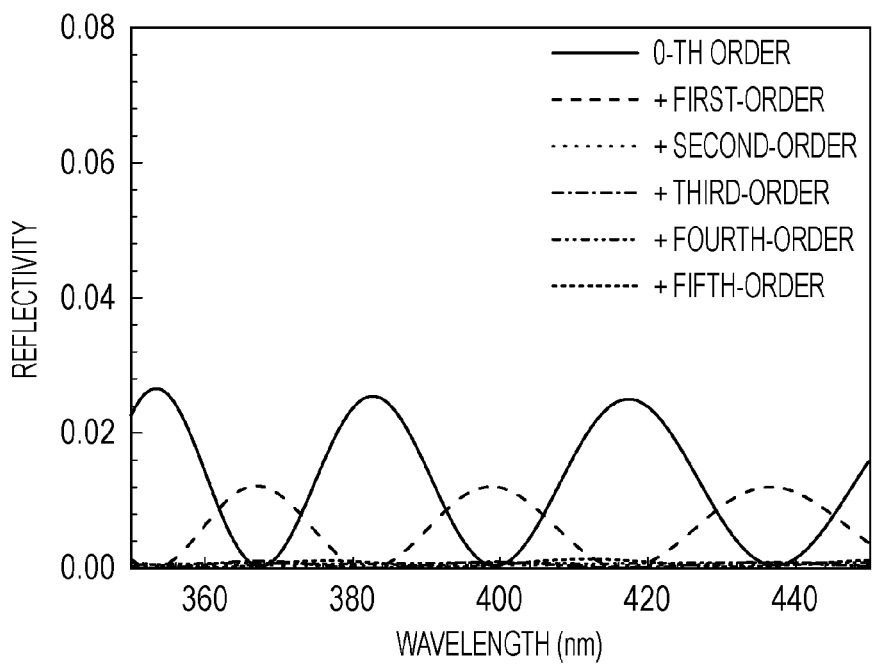
FIG. 3F is a graph to explain the shape of the concave-convex structure and the reflection spectra in the embodiment of the present invention.

FIGS. 3D, 3E and 3F plot the reflection spectra obtained with the structures of FIGS. 3A, 3B and 3C, respectively, and represent reflectivity for each order of diffraction. Be it noted that since the structures for which the reflection spectra are calculated herein are left-right symmetric, the calculation results for minus orders of diffraction are omitted.

Only in FIG. 3D among FIGS. 3D, 3E and 3F, wavelengths at respective reflection peaks of the 0-th order diffracted light and the + first-order diffracted light are matched with each other (e.g., near 410 nm). On the other hand, in FIGS. 3E and 3F, wavelengths at respective reflection peaks of the 0-th order diffracted light and the + first-order diffracted light are shifted from each other substantially by a half period.

In the photonic-crystal surface emitting laser, utilization efficiency of light can be increased by reusing the 0-th order diffracted light in the reflected lights. Accordingly, the 0-th order diffracted light is desirably not reduced. On the other hand, the + first- or higher-order diffracted lights are to be reduced to a minimum level, because those diffracted lights become stray lights.

As seen from the calculation results of FIGS. 3D, 3E and 3F, reflection intensities of the second- or higher-order diffracted lights are very small and are negligible in practice. Thus, it is understood that only the 0-th order and ± first-order diffracted lights need to be taken into consideration here.

If the peak wavelengths of reflectivity of the 0-th order and ± first-order diffracted lights are matched with each other, it is difficult to weaken only the ± first-order diffracted lights while leaving the 0-th order diffracted light. On the other hand, if the reflection peak wavelengths of the 0-th order and ± first-order diffracted lights are shifted from each other, only the 0-th order diffracted light can be left by greatly reducing the ± first-order diffracted lights at an appropriate wavelength. Stated another way, in the photonic-crystal surface emitting laser, it is desirable that the reflection peak wavelengths of the 0-th order and ± first-order diffracted lights differ from each other.

As a result of studies, it has been found that generating light reflection not only at a concave portion of the concave-convex structure, but also at a convex portion thereof is important from the viewpoint of shifting the reflection peak wavelengths of the 0-th order and ± first-order diffracted lights from each other. To describe it with reference to the structure of FIG. 1, the occurrence of light reflection at both an interface between the first layer 110 and the third layer 130 (i.e., a concave portion) and an interface between the mask structure 120 and the third layer 130 (i.e., a convex portion) is the premise in obtaining the results of FIGS. 3E and 3F. In other words, it is required that the first refractive index and the third refractive index differ from each other, and that the second refractive index and the third refractive index differ from each other.

Light can be reflected at both the concave portion and the convex portion of the concave-convex structure with a structure in which a mask material is periodically arrayed immediately on the substrate as illustrated in FIG. 3B, or with a structure in which the substrate is itself processed as illustrated in FIG. 3C.

Here, the ± first-order diffracted lights can be reduced by satisfying such conditions that respective 0-th order diffracted lights are intensified in the reflected lights from the concave portion and the convex portion of the concave-convex structure. More specifically, the reflection intensity of the total 0-th order diffracted light is peaked by adjusting an optical path difference between lights reflected at the concave portion and the convex portion in a direction perpendicular to the substrate to be equal to an integer multiple of wavelength. Thus, the height of the mask structure 120, illustrated in FIG. 1, needs to be adjusted from that point of view.

For example, the action of intensifying the respective 0-th order diffracted lights is increased on condition that the sum (optical path difference) of a value obtained by multiplying two times the height of the mask structure 120 by the third refractive index and a value obtained by calculating, in terms of wavelength, a difference in phase change caused when light is reflected at the concave portion and the convex portion of the concave-convex structure, is closer to an integer multiple of an oscillation wavelength $\lambda$.

Conversely, when the height of the mask structure 120 is adjusted such that the above-mentioned optical path difference is shifted from an integer multiple of the wavelength by a half wavelength, the 0-th order diffracted light is weakened and the ± first-order diffracted lights are intensified. Stated another way, which one of the reflection intensity of the 0-th order diffracted light and the reflection intensity of the ± first-order diffracted lights is intensified can be determined by appropriately designing the relationship between the wavelength and the film thickness.

As is understood from the above discussion, when the optical path difference between the lights reflected at the concave portion and the convex portion is an integer multiple of the wavelength, the 0-th order diffracted light is intensified, and when the optical path difference is shifted from an integer multiple of the oscillation wavelength $\lambda$ by a half wavelength, the ± first-order diffracted lights are intensified. In other words, the condition for intensifying the 0-th order diffracted light and weakening the ± first-order diffracted lights is satisfied when an optical path difference L between the lights reflected at the concave portion and the convex portion is within the following range:

$$n\lambda - (\lambda/4) < L < n\lambda + (\lambda/4) \ (n: \text{integer})$$

More preferably, from the above-described studies, the optical path difference L is an integer multiple of the oscillation wavelength $\lambda$, i.e., $n\lambda$ (n is an integer).

The above expression "integer multiple of the wavelength $\lambda$" implies that the optical path difference L is substantially an integer multiple of the oscillation wavelength $\lambda$. Namely, the case where there are variations of errors in fabrication, etc. is also involved in the scope of the present invention.

Figure 4A:
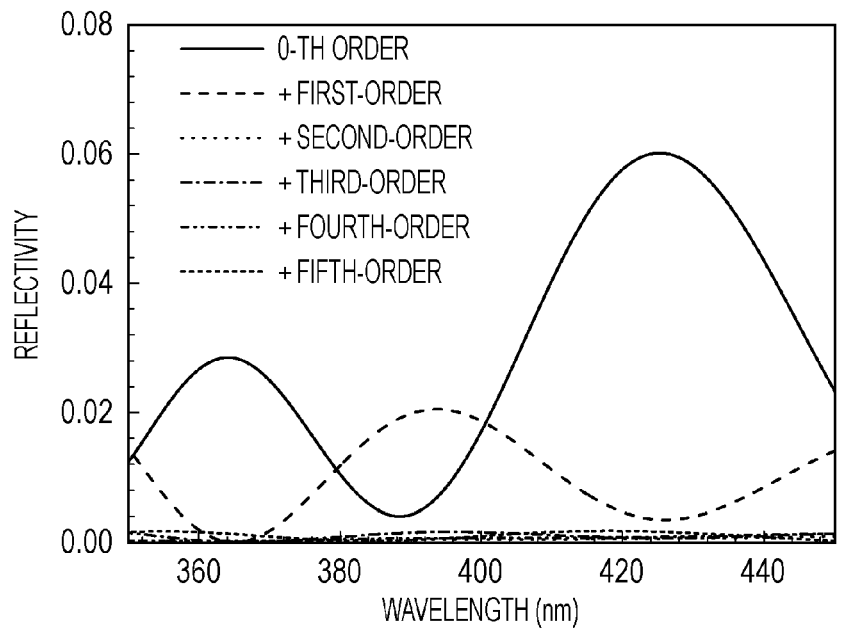
FIG. 4A is a graph to explain a height of the concave-convex structure and reflection spectra in the embodiment of the present invention.
Figure 4B:
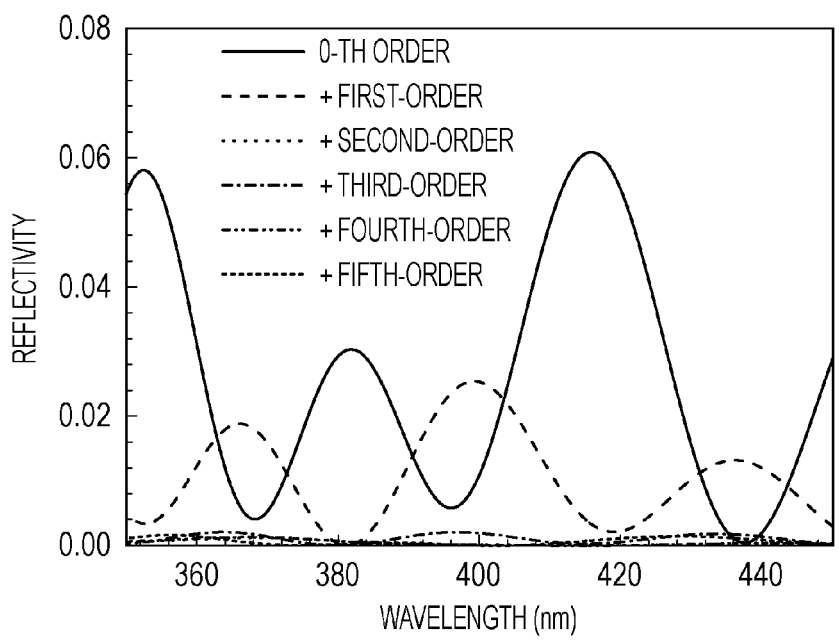
FIG. 4B is a graph to explain a height of the concave-convex structure and reflection spectra in the embodiment of the present invention.

FIGS. 4A and 4B comparatively represent examples when the height of the concave-convex structure is changed. FIGS. 4A and 4B plot the calculation results of the reflection spectra when the concave-convex structure has a height of 500 nm and 900 nm, respectively. In the case of FIG. 4A, the calculation is performed on condition of a similar structure to that illustrated in FIG. 3B except for the height of the concave-convex structure. In the case of FIG. 4B, the calculation is performed on condition of a similar structure to that illustrated in FIG. 3B, including the height of the concave-convex structure. Accordingly, the calculation results of FIG. 4B are the same as those of FIG. 3E.

In consideration of phase change upon reflection as well, the optical path difference between the lights reflected at the concave portion and the convex portion becomes an integer multiple of the oscillation wavelength at wavelengths of 364 nm and 425 nm in a wavelength range of the graph when the height of the concave-convex structure is 500 nm, and at wavelengths of 353 nm, 382 nm and 417 nm in a wavelength range of the graph when the height of the concave-convex structure is 900 nm. Those wavelengths are accurately matched with wavelengths at which the 0-th order diffracted light has reflection peaks in the graphs of FIGS. 4A and 4B.

The surface emitting laser according to this embodiment, which reuses the 0-th order diffracted light, is effective in not only increasing the utilization efficiency of light, but also in controlling a Q value of the photonic crystal.

(Periodicity of Concave-Convex Structure)

In consideration of only the crystal growth, the concave-convex structure is not necessarily required to be periodically arrayed. However, when the concave-convex structure is an aperiodic structure, it is very difficult to control the reflected light in a particular direction because various scattered lights and diffracted lights are generated. In this embodiment, therefore, the concave-convex structure is desirably periodic. The expression "periodic" used herein implies that the concave-convex structure needs to be periodic insofar as the advantageous effect of this embodiment is obtained, and that the concave-convex structure may include errors in fabrication, etc. in an allowable range.

(Pitch, Duty Ratio, Shape, etc. of Concave-Convex Structure)

When the concave-convex structure is a periodic structure, the pitch of the periodic structure may affect the optical characteristics. FIGS. 5A to 5D represent the results calculated when the pitch of the concave-convex structure is changed to 1 µm, 2 µm, 4 µm and 6 µm, respectively. Be it noted that the quotient obtained by dividing a width of the concave portion of the concave-convex periodic structure by the pitch of the concave-convex structure is defined as a duty ratio, and the calculation is performed with the duty ratio fixed to 50%. The other structure parameters than the pitch are the same as those of the structure illustrated in FIG. 3B.

Figure 5A:
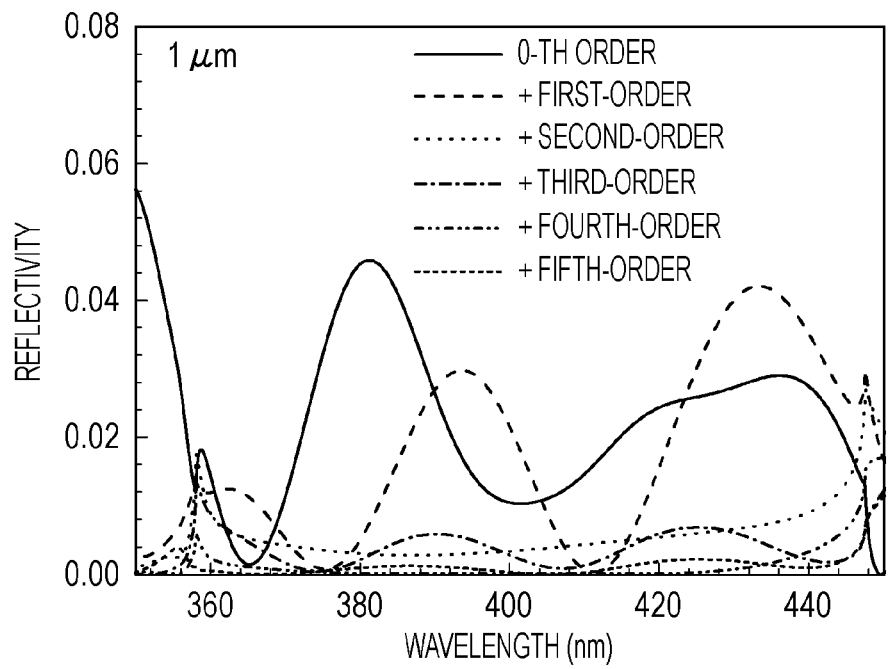
FIG. 5A is a graph to explain a pitch of the concave-convex structure and reflection spectra in the embodiment of the present invention.
Figure 5B:
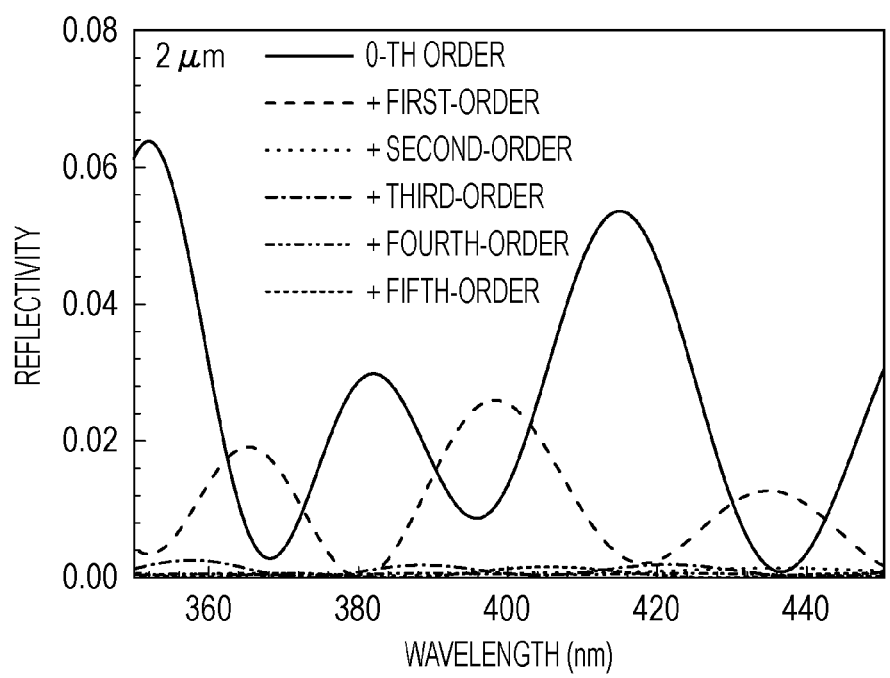
FIG. 5B is a graph to explain a pitch of the concave-convex structure and reflection spectra in the embodiment of the present invention.
Figure 5C:
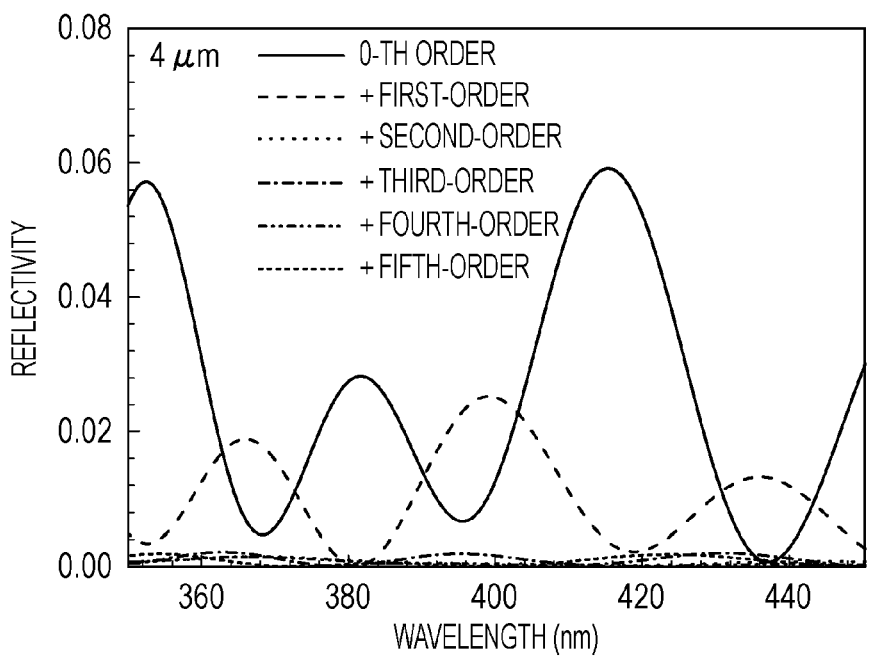
FIG. 5C is a graph to explain a pitch of the concave-convex structure and reflection spectra in the embodiment of the present invention.
Figure 5D:
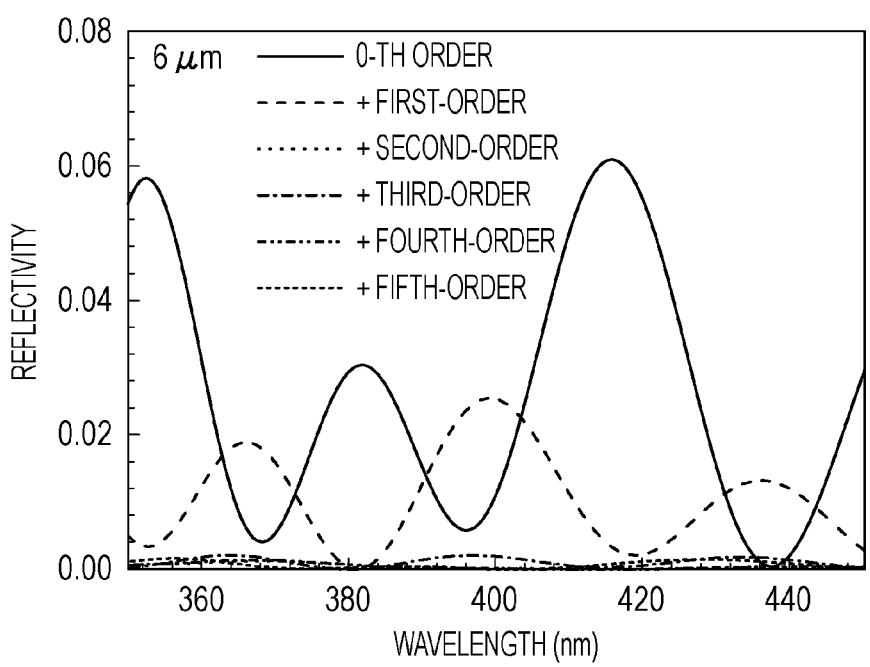
FIG. 5D is a graph to explain a pitch of the concave-convex structure and reflection spectra in the embodiment of the present invention.

When the pitch is relatively large as in FIGS. 5B to 5D, change of the spectrum shape depending on change of the pitch is hardly apparent. Also, reflection intensities of the second- or higher-order diffracted lights are very small.

However, when the pitch is smaller than a certain value as in FIG. 5A, the spectra behave in a complex way and reflection intensities of the second- or higher-order diffracted lights are increased to a non-negligible level. Further, it deems that polarization dependency is also increased as the pitch is reduced. From the viewpoint of device design that is simple and is robust against errors in fabrication, therefore, it is desirable that the pitch of the concave-convex structure is set to be sufficiently large. In practice, the pitch is desirably set larger than the oscillation wavelength $\lambda$ substantially by an order of magnitude.

Figure 6A:
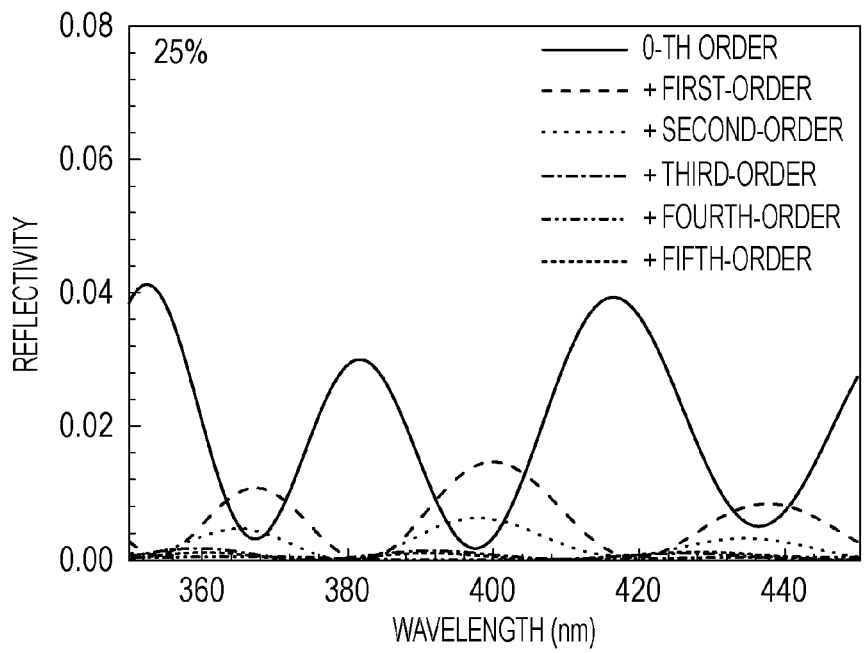
FIG. 6A is a graph to explain a duty ratio of the concave-convex structure and reflection spectra in the embodiment of the present invention.
Figure 6B:
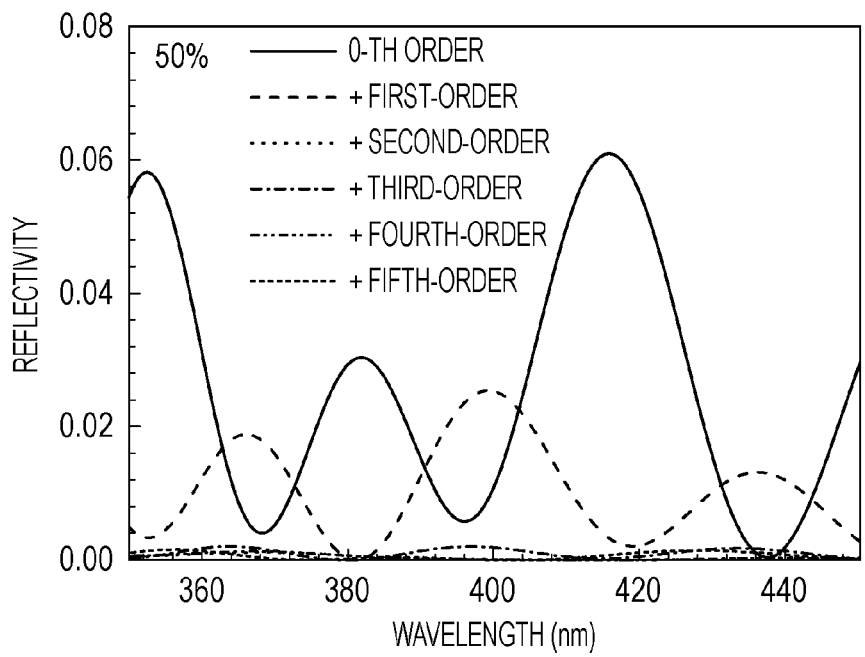
FIG. 6B is a graph to explain a duty ratio of the concave-convex structure and reflection spectra in the embodiment of the present invention.
Figure 6C:
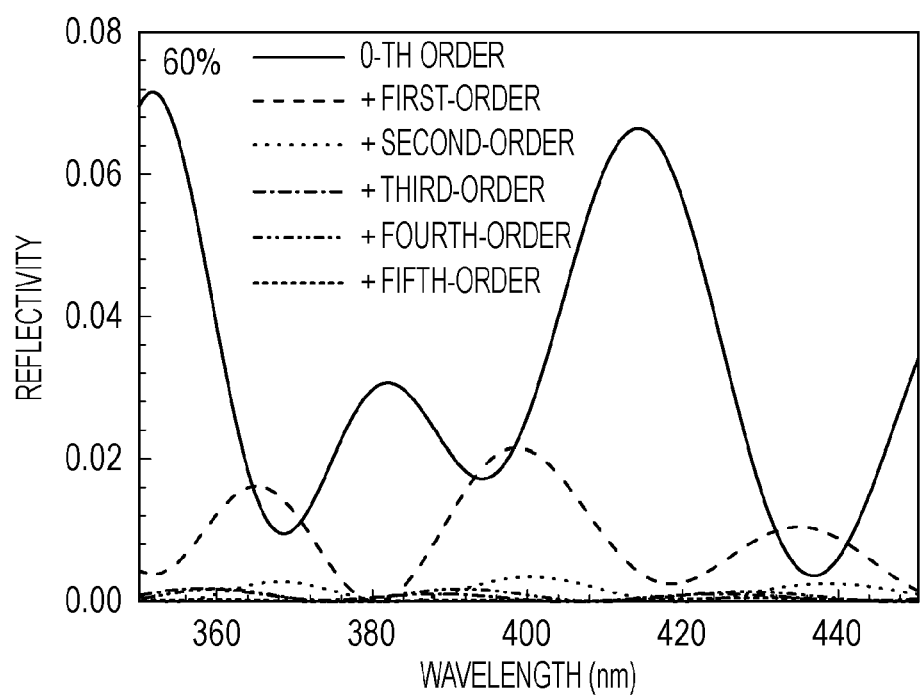
FIG. 6C is a graph to explain a duty ratio of the concave-convex structure and reflection spectra in the embodiment of the present invention.
Figure 7A:
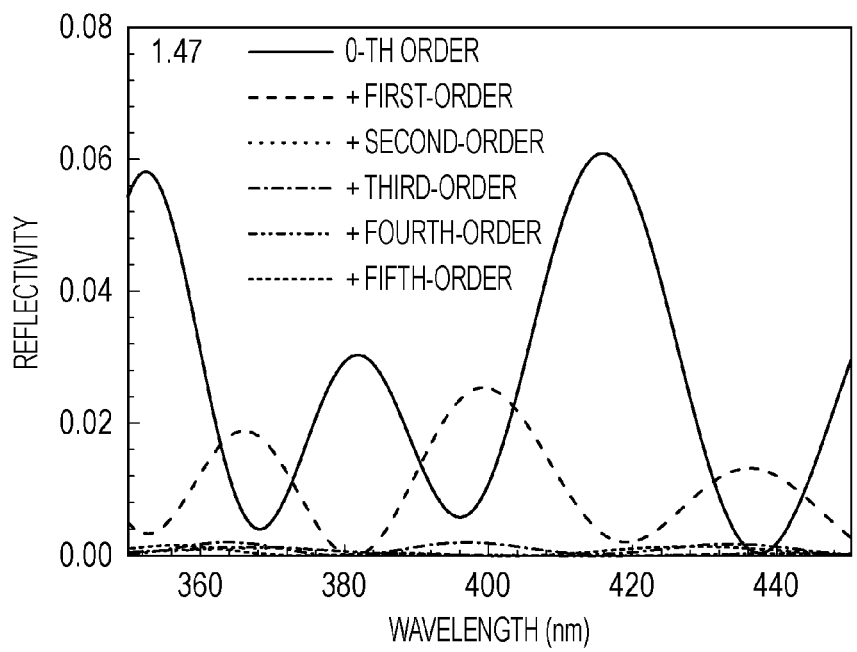
FIG. 7A is a graph to explain a refractive index of the concave-convex structure and reflection spectra in the embodiment of the present invention.
Figure 7B:
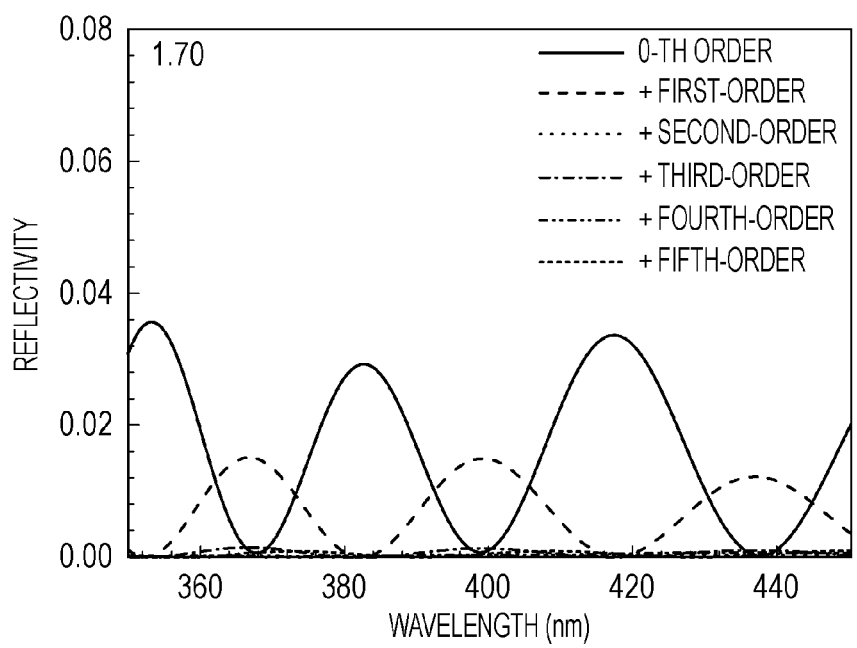
FIG. 7B is a graph to explain a refractive index of the concave-convex structure and reflection spectra in the embodiment of the present invention.
Figure 7C:
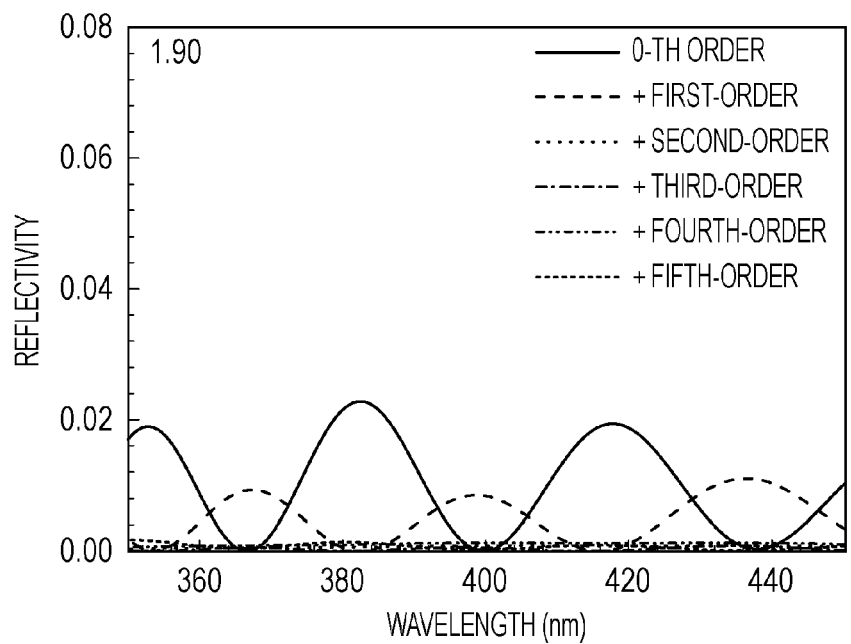
FIG. 7C is a graph to explain a refractive index of the concave-convex structure and reflection spectra in the embodiment of the present invention.
Figure 7D:
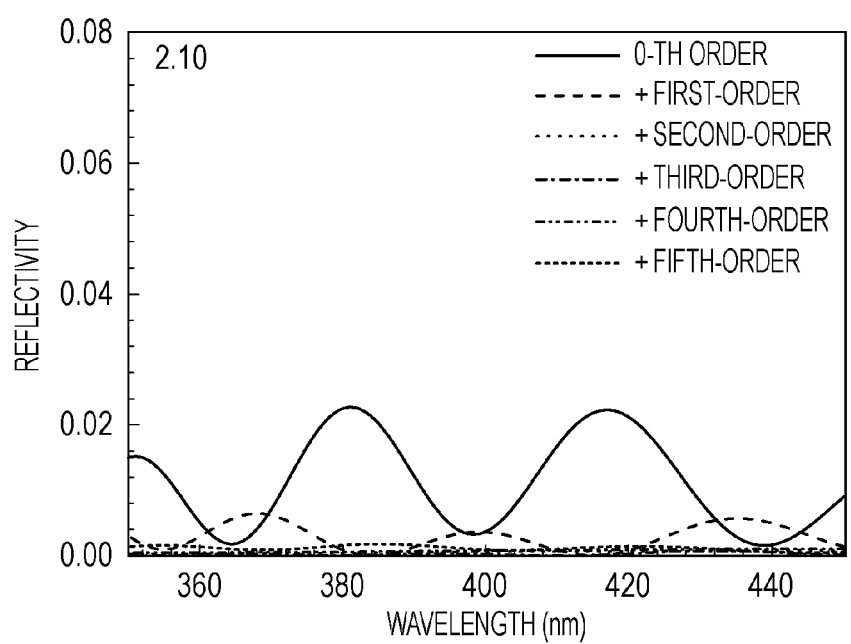
FIG. 7D is a graph to explain a refractive index of the concave-convex structure and reflection spectra in the embodiment of the present invention.

In the case of the periodic structure, the duty ratio may also affect the optical characteristics in addition to the pitch. FIG. 6 plots the results of calculating the duty-ratio dependency while the pitch of the concave-convex periodic structure is fixedly set to 6 µm. FIG. 6A plots the calculation results when the duty ratio is 25%, FIG. 6B plots the calculation results when it is 50%, and FIG. 6C plots the calculation results when the duty ratio is 60%. The other structure parameters than the duty ratio are the same as those of the structure illustrated in FIG. 3B. As seen from comparing those calculation results, the duty ratio affects values of reflectivity, but it does not affect the positions of peak wavelengths.

Patterns of the concave-convex structure are not limited to the above-described stripe pattern. For example, the concave-convex structure may include openings arrayed in a two-dimensional pattern insofar as the ELO technique can be performed without problems. Stated another way, the mask structure in this embodiment is provided in such a form that the members having the second refractive index are arrayed periodically in the in-plane direction, or that openings are formed in the member having the second refractive index periodically in the in-plane direction.

Further, insofar as the ELO technique can be performed without problems, the cross-sectional shape of the concave-convex structure is not necessarily required to be flat, and it may have a rounded shape or a triangular shape.

(Dependency of Concave-Convex Structure on Refractive Index)

Dependency of the concave-convex structure on the refractive index will be described below. FIG. 7 plots, by way of example, the results of calculating reflection spectra when the refractive index of the member 321 is changed in the concave-convex structure illustrated in FIG. 3B.

FIGS. 7A, 7B, 7C and 7D plot the calculation results when the refractive index is 1.47, 1.70, 1.90, and 2.10, respectively. As seen from those calculation results, it is confirmed that even when refractive index is changed, peak wavelengths of the reflection spectra are hardly changed. Thus, the advantageous effect of this embodiment is not greatly affected even when the refractive index of the convex portion of the concave-convex structure is changed.

(Method of Fabricating Concave-Convex Structure)

While the ELO technique can be used without being limited to particular materials, it is practically applied to nitride semiconductors in many cases. The reason is that, at the present time, because a GaN substrate is generally very expensive, a percentage of using a heterogeneous substrate is larger than that in the case utilizing other compound semiconductors.

When the ELO technique is performed on the nitride semiconductors, the substrate is provided as, e.g., a sapphire substrate, a Si substrate, or a SiC substrate. The concave-convex structure is constituted by forming a film of $SiO_2$ and then patterning the $SiO_2$ film, or by etching the substrate itself.

The concave-convex structure can be fabricated by using general techniques, such as photolithography, liftoff, wet etching, and dry etching.

The first layer 110 positioned immediately under the concave-convex structure is not always required to be a substrate.

More specifically, a film made of a different material from that of the substrate may be formed on the substrate, and the concave-convex structure may be formed immediately on the film. Such a structure may be obtained, for example, by growing an AlGaN layer on a GaN substrate, forming $SiO_2$ on the surface of the AlGaN layer and patterning it into a concave-convex shape, and then embedding the patterned $SiO_2$ with GaN by employing the ELO technique.

OTHER EMBODIMENTS

The active layer in the embodiment of the present invention can be provided as an active layer that is used in a general semiconductor laser. The active layer is of, for example, a multiquantum well structure employing GaAs/AlGaAs, GaInP/AlGaInP, GaN/InGaN, or other suitable materials.

Further, the surface emitting laser according to the embodiment can be operated at an arbitrary wavelength.

The surface emitting laser according to the embodiment can be driven with an optical pumping method or an electric current injection method. Be it noted that, in FIG. 1, electrodes are omitted.

The surface emitting laser according to the embodiment may be arrayed in plural on the same plane and used as a light source in the form of an array.

The surface emitting laser or the surface emitting laser array according to the embodiment can also be utilized as a light source for drawing an image on a photosensitive drum in a copying machine or an image forming apparatus, such as a laser printer.

EXAMPLES

EXAMPLES of the embodiments of the present invention will be described below.

Example 1

A photonic-crystal surface emitting laser according to EXAMPLE 1 is described with reference to FIG. 8.

Figure 8A:
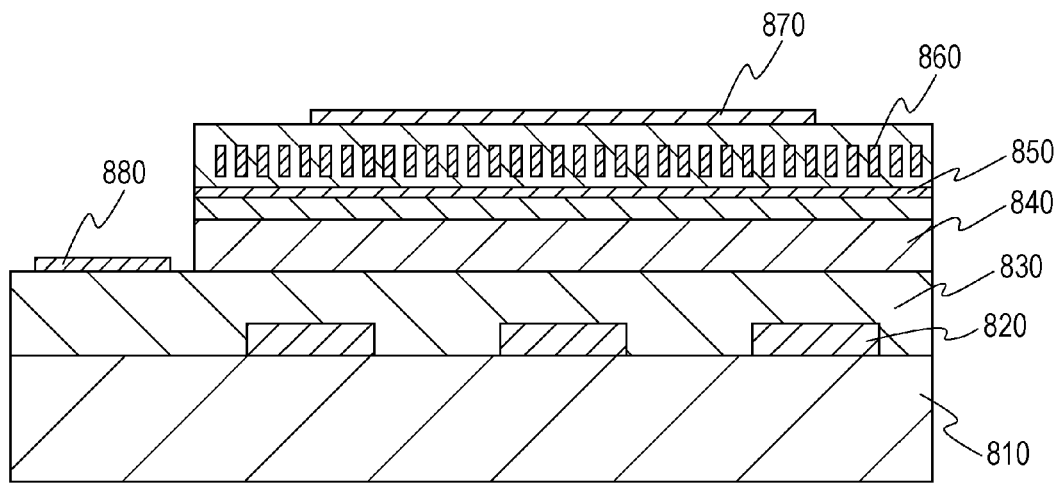
FIG. 8A is a schematic view to explain a photonic-crystal surface emitting laser according to EXAMPLE 1 of the present invention.

FIG. 8A is a schematic view to explain a laser structure of this EXAMPLE. Striped structure members 820 made of $SiO_2$ and having a width of 3 μm and a height of 900 nm are periodically arrayed at a pitch of 6 μm on a sapphire substrate 810. GaN 830 is grown by employing the ELO technique such that the $SiO_2$ striped structure members 820 are embedded with the GaN 830. An $Al_{0.1}Ga_{0.9}N$ clad layer 840, an active layer 850, and a two-dimensional photonic crystal 860 are successively formed on the GaN 830. The two-dimensional photonic crystal 860 includes two-dimensionally arrayed columnar holes formed therein. The lattice form is a square lattice, and the lattice constant is 165 nm. The holes have a circular shape.

The active layer 850 is of an $In_{0.09}Ga_{0.9}N/In_{0.02}Ga_{0.98}N$ multiquantum well structure in three periods.

A p-electrode 870 and an n-electrode 880 are disposed on the surface of the laser structure. Laser oscillation is caused by injecting an electric current through those electrodes.

The laser structure of this EXAMPLE is designed to cause the laser oscillation at a wavelength of 415 nm.

Figure 8B:
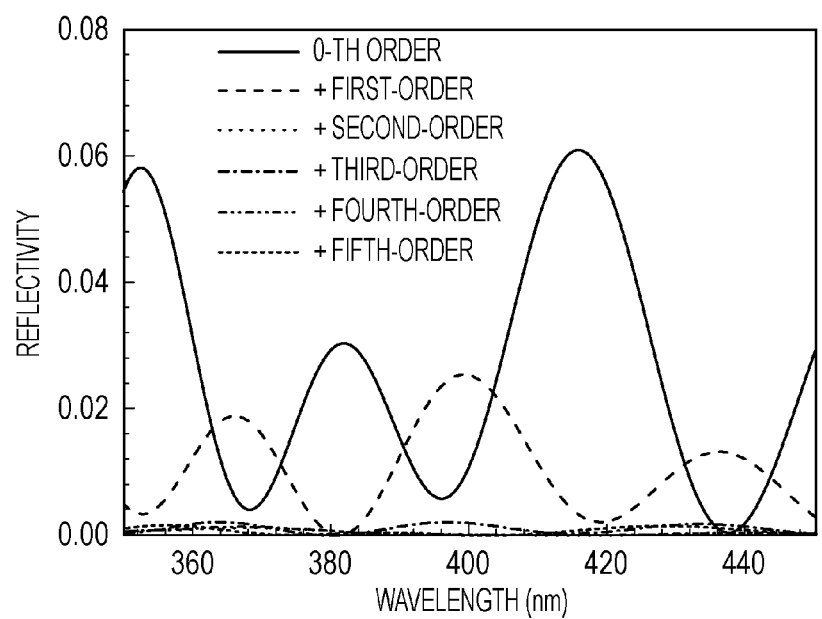
FIG. 8B is an illustration to explain the photonic-crystal surface emitting laser according to EXAMPLE 1 of the present invention.

FIG. 8B plots the results of calculating the reflectivity with the $SiO_2$ striped structure members 820 in the laser structure of this EXAMPLE. The reflectivity at a wavelength of 415 nm is 6.1% for the 0-th order diffracted light, 0.3% for the + first-order diffracted light, 0.0% for the + second-order diffracted light, and 0.0% for the + third-order diffracted light. Thus, the reflectivity for each of the diffracted lights other than the 0-th order diffracted light can be effectively reduced.

As a result, the laser structure of this EXAMPLE can reduce the first-order diffracted light that is output in the oblique direction as extra stray light.

Example 2

A photonic-crystal surface emitting laser according to EXAMPLE 2 is described with reference to FIG. 9.

Figure 9A:
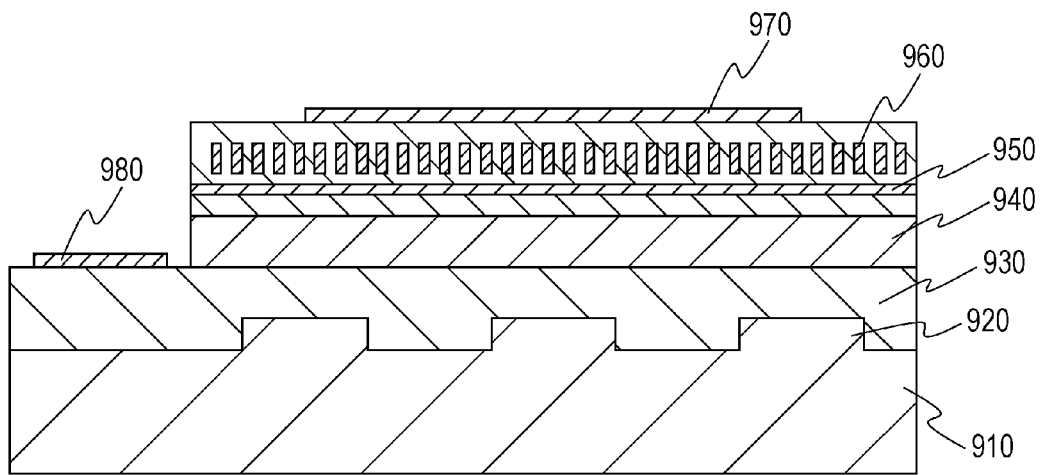
FIG. 9A is a schematic view to explain a photonic-crystal surface emitting laser according to EXAMPLE 2 of the present invention.

FIG. 9A is a schematic view to explain a laser structure of this EXAMPLE. A striped concave-convex structure 920 is formed by processing a sapphire substrate 910, and GaN 930 is grown on the striped concave-convex structure 920.

The concave-convex structure has a pitch of 4 μm and a duty ratio of 50%. A convex portion of the concave-convex structure has a height of 900 nm.

Such a method of forming the concave-convex structure by processing the substrate and then executing lateral growth is called an LEPS (Lateral Epitaxy on Patterned Substrate) technique instead of the ELO technique.

The construction of EXAMPLE 2 other than the concave-convex structure is the same as that in EXAMPLE 1, and EXAMPLE 2 is designed to cause the laser oscillation at a wavelength of 415 nm.

Figure 9B:
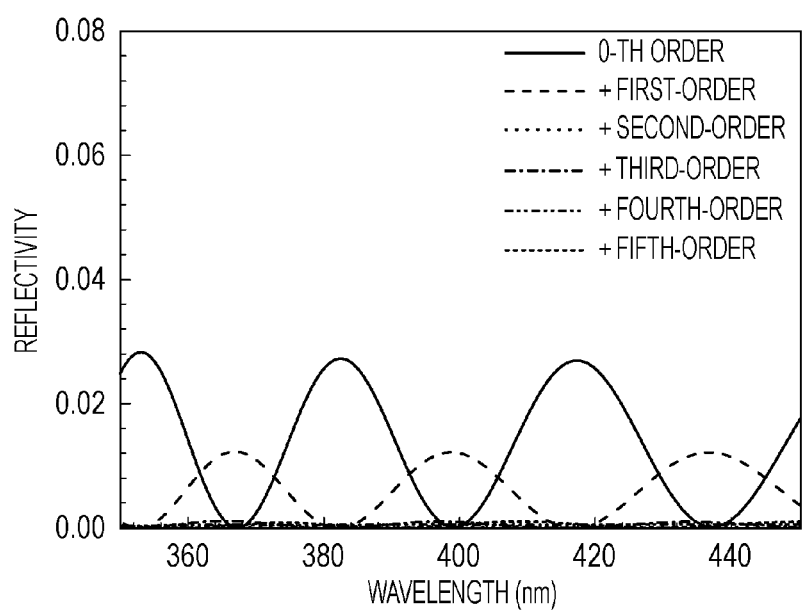
FIG. 9B is an illustration to explain the photonic-crystal surface emitting laser according to EXAMPLE 2 of the present invention.

FIG. 9B plots the results of calculating the reflectivity with the concave-convex structure 920 in the laser structure of this EXAMPLE. The reflectivity with the concave-convex structure 920 at a wavelength of 415 nm is 2.7% for the 0-th order diffracted light and 0.0% for the + first-order diffracted light. Thus, it is confirmed that EXAMPLE 3 can also provide a similar advantageous effect to that obtained with EXAMPLE 1.

Example 3

An image forming apparatus using a light source in the form of a surface emitting laser array, which is constituted by arraying the above-described surface emitting laser in plural, will be described below with reference to FIG. 10.

Figure 10A:
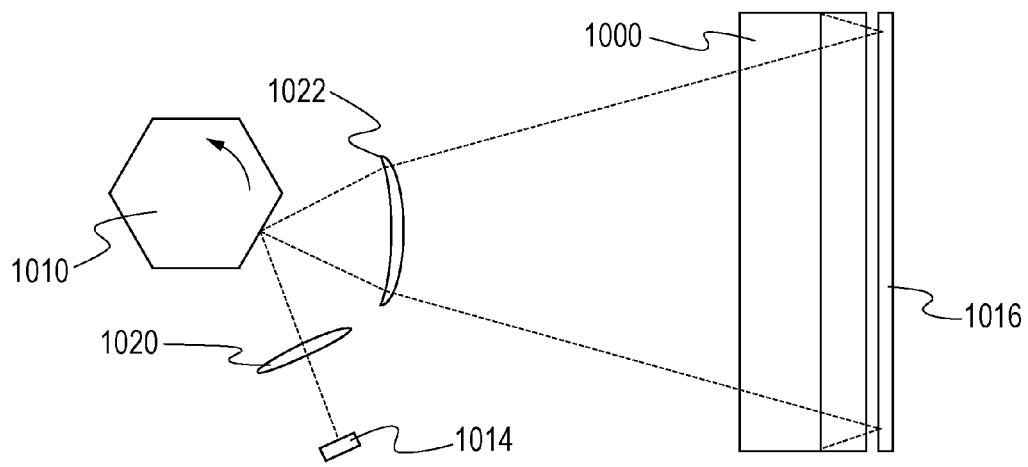
FIG. 10A is a schematic view to explain an image forming apparatus according to EXAMPLE 3 of the present invention.
Figure 10B:
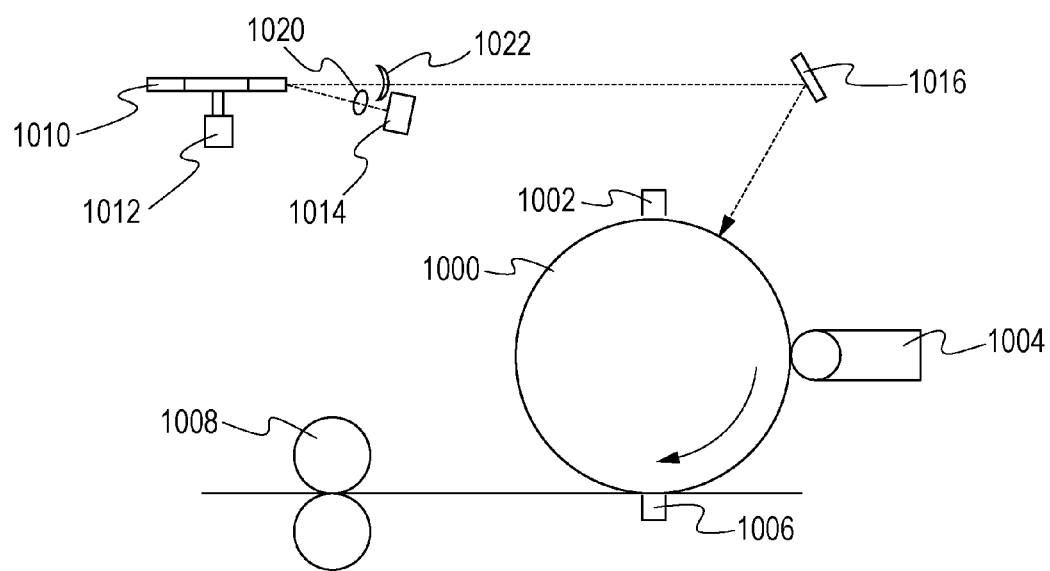
FIG. 10B is a schematic view to explain the image forming apparatus according to EXAMPLE 3 of the present invention.
Figure 11:
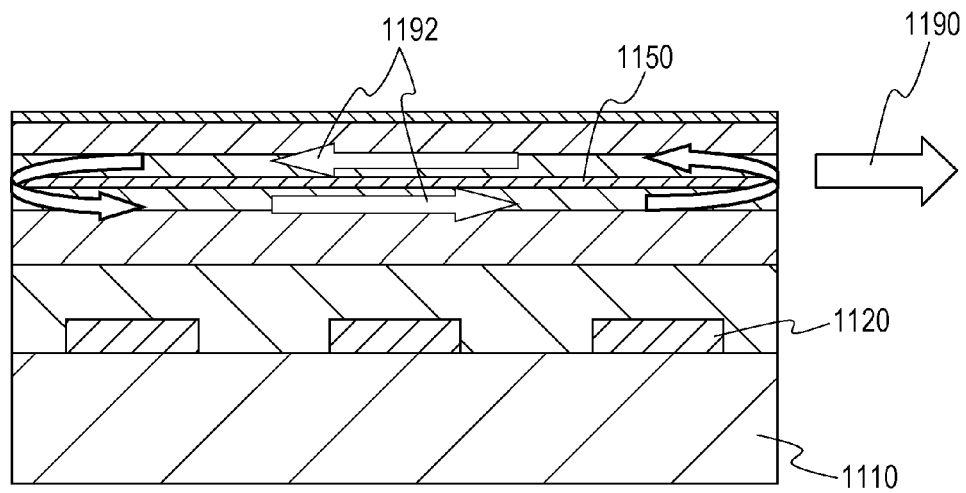
FIG. 11 is a schematic view to explain a light propagating direction in an edge emitting semiconductor laser.

FIG. 10A is a plan view of the image forming apparatus, and FIG. 10B is a side view of the image forming apparatus.

In FIG. 10, reference numeral 1000 denotes a photosensitive drum (photosensitive member), 1002 denotes a charger, 1004 denotes a developing device, 1006 denotes a transfer charger, 1008 denotes a fusing device, 1010 denotes a rotatable polygon mirror, and 1012 denotes a motor. Further, reference numeral 1014 denotes a light source in the form of a surface emitting laser array, 1016 denotes a reflecting mirror, 1020 denotes a collimator lens, and 1022 denotes an f-θ lens.

In FIG. 10, the motor 1012 rotationally drives the rotatable polygon mirror 1010.

The surface emitting laser array 1014 serves as a light source for recording, which is turned on or off by a driver in accordance with an image signal. Laser light thus optically modulated is emitted from the surface emitting laser array 1014 to the rotatable polygon mirror 1010 through a collimator lens 1020.

The rotatable polygon mirror 1010 is rotated in a direction denoted by an arrow. With the rotation of the rotatable polygon mirror 1010, the laser light output from the surface emitting laser array 1014 is reflected by a reflecting surface of the rotatable polygon mirror 1010 as a deflection beam of which emergence angle is continuously changed. The reflected light is subjected to, e.g., correction of distortion aberration through the f-θ lens 1022 and is directed to the photosensitive drum 1000 through the reflecting mirror 1016 to be scanned over the photosensitive drum 1000 in the main scanning direction.

The photosensitive drum 1000 is previously charged by the charger 1002 and is successively exposed with scanning of the laser light, whereby an electrostatic latent image is formed. With the photosensitive drum 1000 rotated in a direction denoted by an arrow, the formed electrostatic latent image is developed into a visible image by the developing device 1004, and the developed visible image is transferred to a sheet of transfer paper by the transfer charger 1006. The sheet of transfer paper including the visible image transferred thereto is conveyed to the fusing device 1008. After the visible image has been fused and fixed, the sheet of transfer paper is discharged to the outside of the image forming apparatus.

With the embodiments of the present invention, the laser structure capable of reducing the influence caused by the concave-convex structure on the laser characteristics can be obtained when the ELO technique is applied to the photonic-crystal surface emitting laser.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of International Patent Application No. PCT/JP2010/065875, filed Sep. 14, 2010, which is hereby incorporated by reference herein in its entirety.

The invention claimed is:

1. A photonic-crystal surface emitting laser including an active layer and a photonic crystal, which has a resonance mode in an in-plane direction of a substrate, and oscillating at a wavelength $\lambda$, the photonic-crystal surface emitting laser comprising:
   a first layer having a first refractive index;
   a mask structure array formed on the first layer, the mask structure including members having a second refractive index and arrayed periodically in the in-plane direction of the substrate, or including a member having the second refractive index and including openings arrayed periodically in the in-plane direction of the substrate, and a pitch of the mask structure array is equal to or more than 4.4 times of an oscillation wavelength $\lambda$;
   a third layer formed on the first layer and the mask structure and having a third refractive index differing from the first refractive index and the second refractive index; and
   the photonic crystal formed on the third layer,
   wherein a concave-convex periodic structure, which is constituted by the first layer and the mask structure, is configured such that a reflection peak wavelength of 0-th order diffracted light and a reflection peak wavelength of first-order diffracted light differ from each other, and intensity of the 0-th order diffracted light reflected from the concave-convex periodic structure is larger than intensity of the first-order diffracted light reflected from the concave-convex periodic structure at the wavelength $\lambda$.

2. The photonic-crystal surface emitting laser according to claim 1, wherein an optical path difference L between lights reflected at a concave portion and a convex portion of the concave-convex periodic structure and the wavelength $\lambda$ satisfy a following formula:

$$n\lambda-(\lambda/4)<L<n\lambda+(\lambda/4) \ (n: \text{integer})$$

3. The photonic-crystal surface emitting laser according to claim 1, wherein an optical path difference L between lights reflected at a concave portion and a convex portion of the concave-convex periodic structure is an integer multiple of the wavelength $\lambda$.

4. The photonic-crystal surface emitting laser according to claim 1, wherein the first refractive index and the second refractive index differ from each other.

5. The photonic-crystal surface emitting laser according to claim 1, wherein the first refractive index and the second refractive index are the same.

6. A photonic-crystal surface emitting laser array including a plurality of the photonic-crystal surface emitting laser elements, each of the photonic-crystal surface emitting laser elements is according to claim 1.

7. An image forming apparatus comprising the photonic-crystal surface emitting laser array according to claim 6, and a photosensitive member irradiated with laser light from the photonic-crystal surface emitting laser array.

8. The photonic-crystal surface emitting laser according to claim 1, wherein at least one of a height of the mask structure, a pitch of the concave-convex periodic structure, a duty ratio of the concave-convex periodic structure, and a refraction index of the concave-convex periodic structure is configured such that the reflection peak wavelength of the 0-th order diffracted light and the reflection peak wavelength of the first-order diffracted light differ from each other, and
   the intensity of the 0-th order diffracted light reflected from the concave-convex periodic structure is larger than the intensity of the first-order diffracted light reflected from the concave-convex periodic structure at the wavelength $\lambda$.

9. The photonic-crystal surface emitting laser according to claim 1, wherein the third layer is directly formed on the first layer and the mask structure.

10. The photonic-crystal surface emitting laser according to claim 1, wherein the pitch of the mask structure array is equal to or more than 10 times of an oscillation wavelength $\lambda$.

* * * * *